United States Patent
Asanuma et al.

(10) Patent No.: US 11,290,056 B2
(45) Date of Patent: Mar. 29, 2022

(54) SOLAR POWER GENERATION FAULT DIAGNOSIS DEVICE AND SOLAR POWER GENERATION FAULT DIAGNOSIS METHOD

(71) Applicant: TAIYO YUDEN CO., LTD., Tokyo (JP)

(72) Inventors: Kazuo Asanuma, Gunma (JP); Norio Kurisu, Gunma (JP)

(73) Assignee: TAIYO YUDEN CO., LTD., Tokyo (JP)

(*) Notice: Subject to any disclaimer, the term of this patent is extended or adjusted under 35 U.S.C. 154(b) by 0 days.

(21) Appl. No.: 16/997,713

(22) Filed: Aug. 19, 2020

(65) Prior Publication Data
US 2020/0382056 A1    Dec. 3, 2020

Related U.S. Application Data

(63) Continuation of application No. PCT/JP2019/002616, filed on Jan. 28, 2019.

(30) Foreign Application Priority Data

Feb. 20, 2018 (JP) .............................. JP2018-027752

(51) Int. Cl.
*G01R 27/16* (2006.01)
*H02S 50/10* (2014.01)

(52) U.S. Cl.
CPC .............. *H02S 50/10* (2014.12); *G01R 27/16* (2013.01)

(58) Field of Classification Search
CPC ......... H02S 50/10; H02S 50/00; G01R 27/16; G01R 31/56; Y02E 10/50
(Continued)

(56) References Cited

U.S. PATENT DOCUMENTS

2012/0134058 A1* 5/2012 Pamer ................... H02S 50/10
                                                           361/42
2012/0268158 A1   10/2012 Miyata et al.
(Continued)

FOREIGN PATENT DOCUMENTS

JP        2013-502054 A    1/2013
JP        2014-216501 A   11/2014
(Continued)

OTHER PUBLICATIONS

International Search Report (ISR) issued in PCT/JP2019/002616 dated Apr. 2019.
(Continued)

*Primary Examiner* — Tung X Nguyen
*Assistant Examiner* — Robert P Alejnikov, Jr.
(74) *Attorney, Agent, or Firm* — Chen Yoshimura LLP

(57) ABSTRACT

A solar power generation fault diagnosis device includes one or more processors configured to perform the following: receiving signals indicating an electrical quantity output from a solar cell to acquire quantity information indicating the electrical quantity output from the solar cell; calculating a first quantity value relating to the electrical quantity based on the quantity information; implementing a low-pass filter unit so as to output a second quantity value from the first quantity value; determining a state of the solar cell based on a result of comparison between the first quantity value and the second quantity value; and outputting the determined state of the solar cell.

8 Claims, 15 Drawing Sheets

(58) Field of Classification Search
USPC .................................................. 324/761.01
See application file for complete search history.

(56) References Cited

U.S. PATENT DOCUMENTS

| | | | |
|---|---|---|---|
| 2013/0110430 A1* | 5/2013 | Nishi ................... | H01M 10/48 |
| | | | 702/63 |
| 2013/0113302 A1* | 5/2013 | Jeong ................ | H01L 31/02021 |
| | | | 307/117 |
| 2016/0276977 A1 | 9/2016 | Chaintreuil et al. | |
| 2016/0315584 A1* | 10/2016 | Kouno ................... | G01R 27/02 |
| 2017/0102675 A1* | 4/2017 | Drees ................ | G05B 13/0205 |

FOREIGN PATENT DOCUMENTS

| | | |
|---|---|---|
| JP | 2015-99858 A | 5/2015 |
| JP | 2016-144244 A | 8/2016 |
| JP | 2016-220493 A | 12/2016 |
| WO | 2011/017721 A1 | 2/2011 |
| WO | 2011/101916 A1 | 8/2011 |

OTHER PUBLICATIONS

Written Opinion (PCT/ISA/237) issued in PCT/JP2019/002616 dated Apr. 2019. (Concise Explanation of Relevance: This Written Opinion considers that some of the claims are not described by or obvious over the references Nos. 2-6 and U.S. Patent Publication No. 3).
English translation of Written Opinion (PCT/ISA/237) issued in PCT/JP2019/002616 dated Apr. 2019.

* cited by examiner

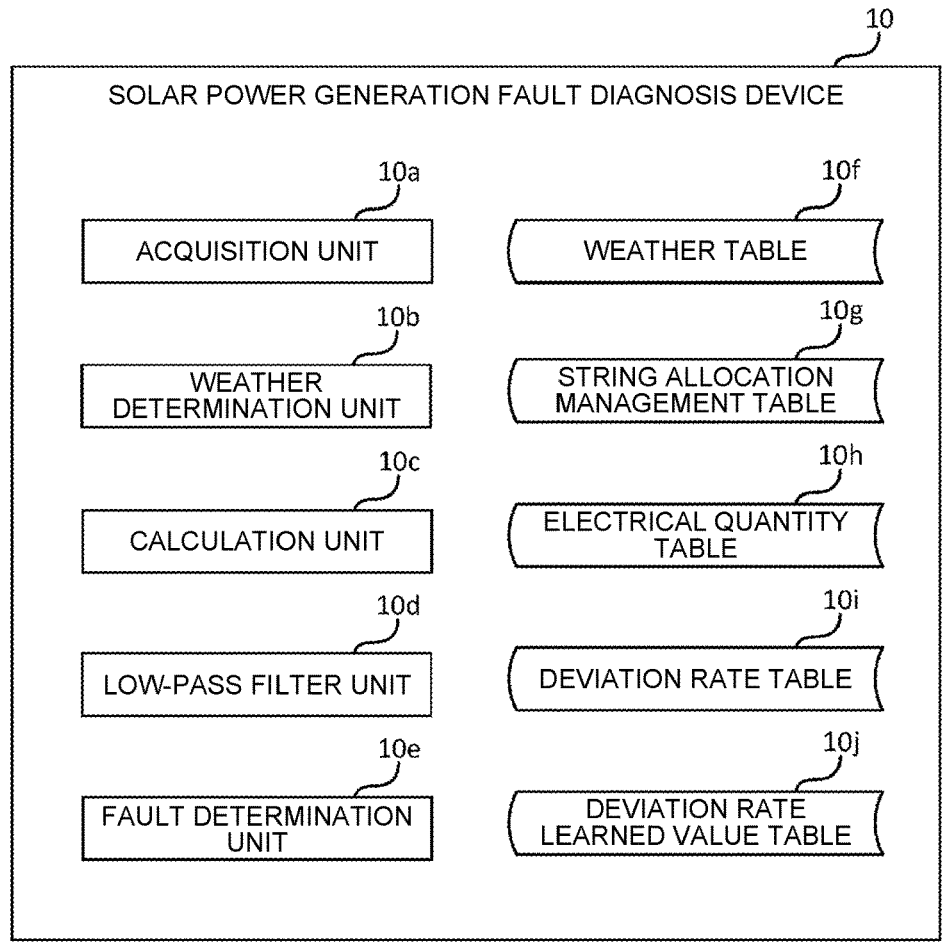

FIG.12

STRING ALLOCATION MANAGEMENT TABLE 10g

| STRING ID | PHYSICAL ADDRESS |
|---|---|
| 1-1-1 | 00158d00001a2b01 |
| 1-1-2 | 00158d00001a2b02 |
| 1-1-3 | 00158d00001a2b03 |
| 1-2-1 | 00158d00001a2b05 |
| 1-2-2 | 00158d00001a2b06 |
| 1-2-3 | 00158d00001a2b07 |
| ⋮ | ⋮ |

FIG.13

ELECTRICAL QUANTITY TABLE 10h

| STRING ID | ELECTRIC CURRENT VALUE [A] | | VOLTAGE VALUE [V] | | IMPEDANCE VALUE [Ω] | |
|---|---|---|---|---|---|---|
| | ELECTRIC CURRENT VALUE | AVERAGE | VOLTAGE VALUE | AVERAGE | IMPEDANCE VALUE | AVERAGE |
| 1-1-1 | A11 | A1 | V11 | V1 | Z11 | Z1 |
| 1-1-2 | A12 | | V12 | | Z12 | |
| 1-1-3 | A13 | | V13 | | Z13 | |
| 1-2-1 | A21 | A2 | V21 | V2 | Z21 | Z2 |
| 1-2-2 | A22 | | V22 | | Z22 | |
| 1-2-3 | A23 | | V23 | | Z23 | |
| ⋮ | ⋮ | ⋮ | ⋮ | ⋮ | ⋮ | ⋮ |

FIG.14

DEVIATION RATE TABLE 10i

|  | DEVIATION RATE [%] | | | |
|---|---|---|---|---|
| TIME | 1-1-1 | 1-1-2 | 1-1-3 | · · · · · · · · |
| 9:00 | +1.5 | +1.8 | +0.5 | · · · · · · · · |
| 9:01 | +1.6 | +1.9 | +0.4 | · · · · · · · · |
| 9:02 | +1.6 | +2.0 | +0.6 | · · · · · · · · |
| ⋮ | ⋮ | ⋮ | ⋮ | |

FIG.15

DEVIATION RATE LEARNED VALUE TABLE 10j

|  | DEVIATION RATE LEARNED VALUE [%] | | | |
|---|---|---|---|---|
| TIME | 1-1-1 | 1-1-2 | 1-1-3 | · · · · · · · · |
| 9:00 | +1.3 | +1.5 | +0.3 | · · · · · · · · |
| 9:01 | +1.3 | +1.5 | +0.3 | · · · · · · · · |
| 9:02 | +1.3 | +1.5 | +0.4 | · · · · · · · · |
| ⋮ | ⋮ | ⋮ | ⋮ | |

SOLAR POWER GENERATION FAULT DIAGNOSIS DEVICE AND SOLAR POWER GENERATION FAULT DIAGNOSIS METHOD

FIELD

An embodiment described herein relates generally to a solar power generation fault diagnosis device, a solar power generation fault diagnosis method, and a computer program product.

BACKGROUND

Devices for use in diagnosing malfunctions of solar power generation systems are known, for example (e.g., see Japanese Patent Application Laid-open No. 2016-220493).

The device according to the conventional technology disclosed in Japanese Patent Application Laid-open No. 2016-220493 is configured to learn estimation parameters by removing unsuitable output power data and sequentially updating the remaining output power data from the measured data for a solar power generation system. The device calculates an estimated power output based on the estimation parameters and weather conditions, and compares the estimated power output with the actual power output. When the actual power output is lower than the estimated power output by a certain value or more, the conventional device determines that the solar power generation system is faulty.

The device according to the conventional technology compares the actual power output with the estimated power output on an absolute basis, and this configuration may fail to include, in the fault determination, output variations attributable to the installation environment or intrinsic properties of the solar power generation system.

In this regard, the conventional device catches, in some cases, the output fluctuations attributable to the installation environment or intrinsic properties of the solar power generation system and determines that the solar power generation system is faulty.

SUMMARY

According to an embodiment of the present disclosure, a solar power generation fault diagnosis device includes one or more processors configured to perform the following: receiving signals indicating an electrical quantity output from a solar cell to acquire quantity information indicating the electrical quantity output from the solar cell; calculating a first quantity value relating to the electrical quantity based on the quantity information; implementing a low-pass filter unit so as to output a second quantity value from the first quantity value; determining a state of the solar cell based on a result of comparison between the first quantity value and the second quantity value; and outputting the determined state of the solar cell.

Other aspects of the present invention will be apparent from the description below and the accompanying drawings.

BRIEF DESCRIPTION OF DRAWINGS

FIG. 10 is a diagram illustrating an exemplary software configuration of the solar power generation fault diagnosis device;
FIG. 11 is an exemplary weather table;
FIG. 12 is an exemplary string allocation management table;
FIG. 13 is an exemplary electrical quantity table;
FIG. 14 is a table illustrating an exemplary deviation rate table;
FIG. 15 is an exemplary deviation rate learned value table.

DETAILED DESCRIPTION

Figure 1:
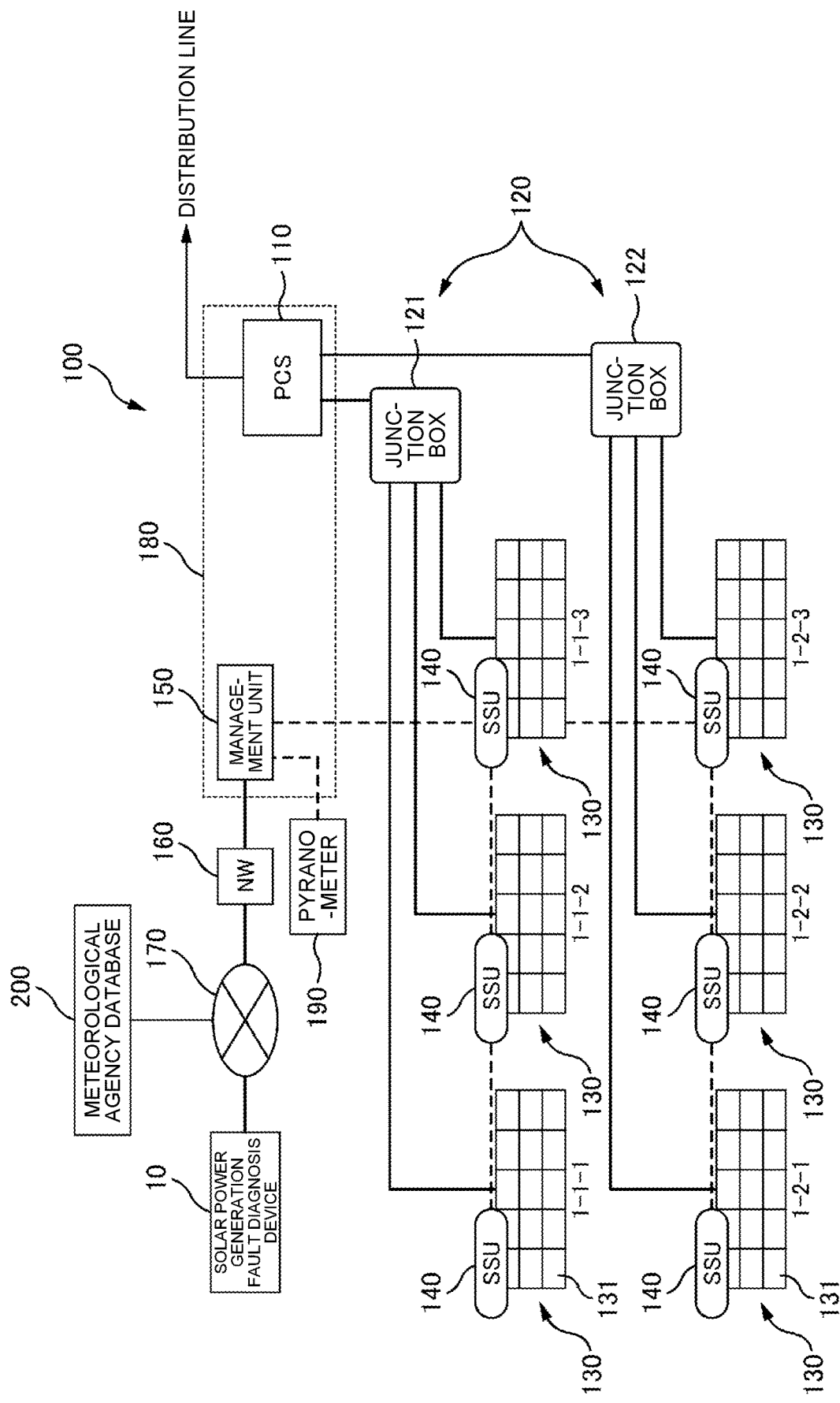
FIG. 1 is a diagram illustrating an exemplary configuration of a solar power generation system.

According to the present description and the accompanying drawings, at least the following topics will become apparent. In FIGS. 1 to 19, same reference numerals are used to describe the same elements.

Configuration of Solar Power Generation System 100

Figure 2:
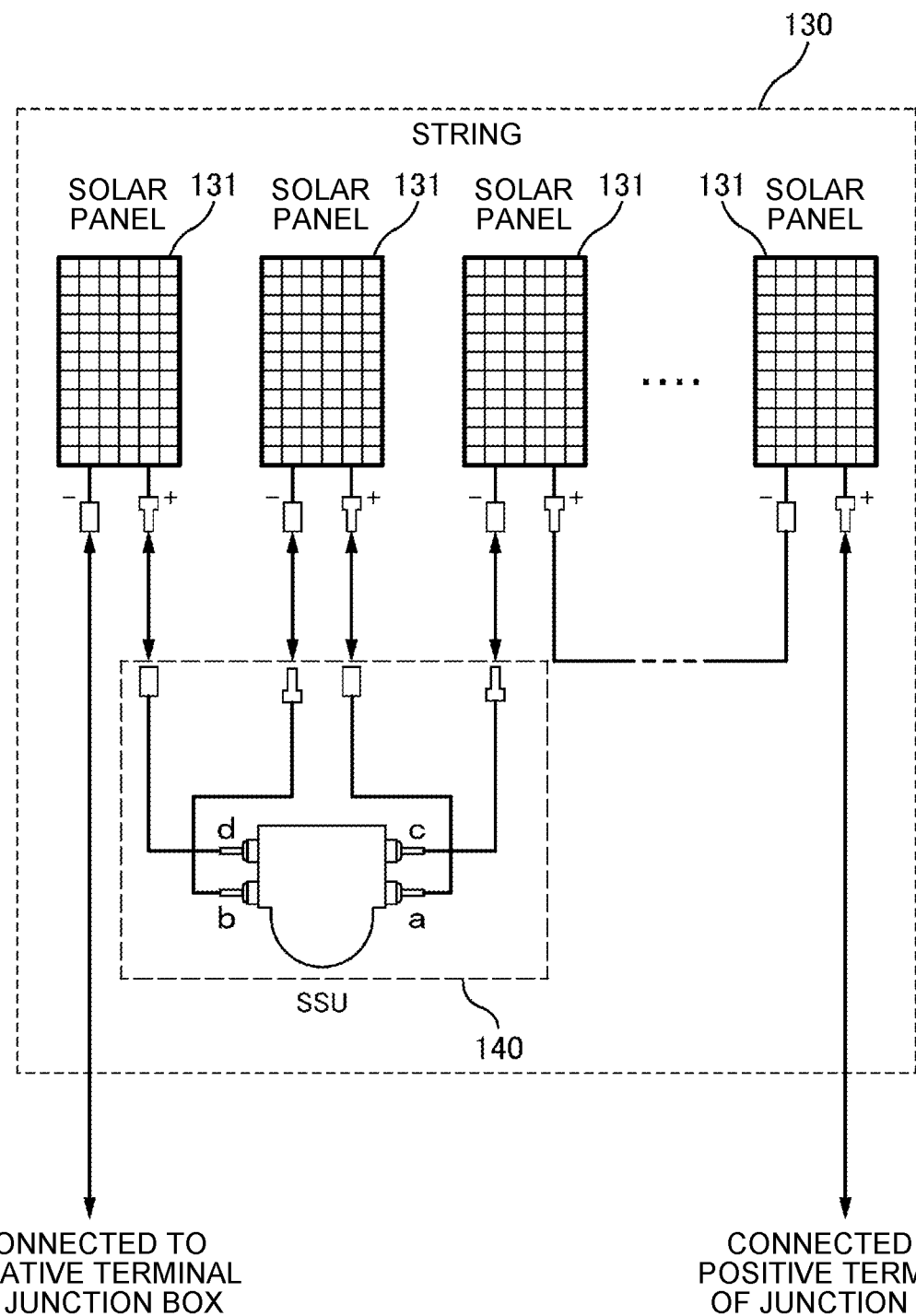
FIG. 2 is a diagram illustrating how a string sensor unit is connected to a string.
Figure 3:
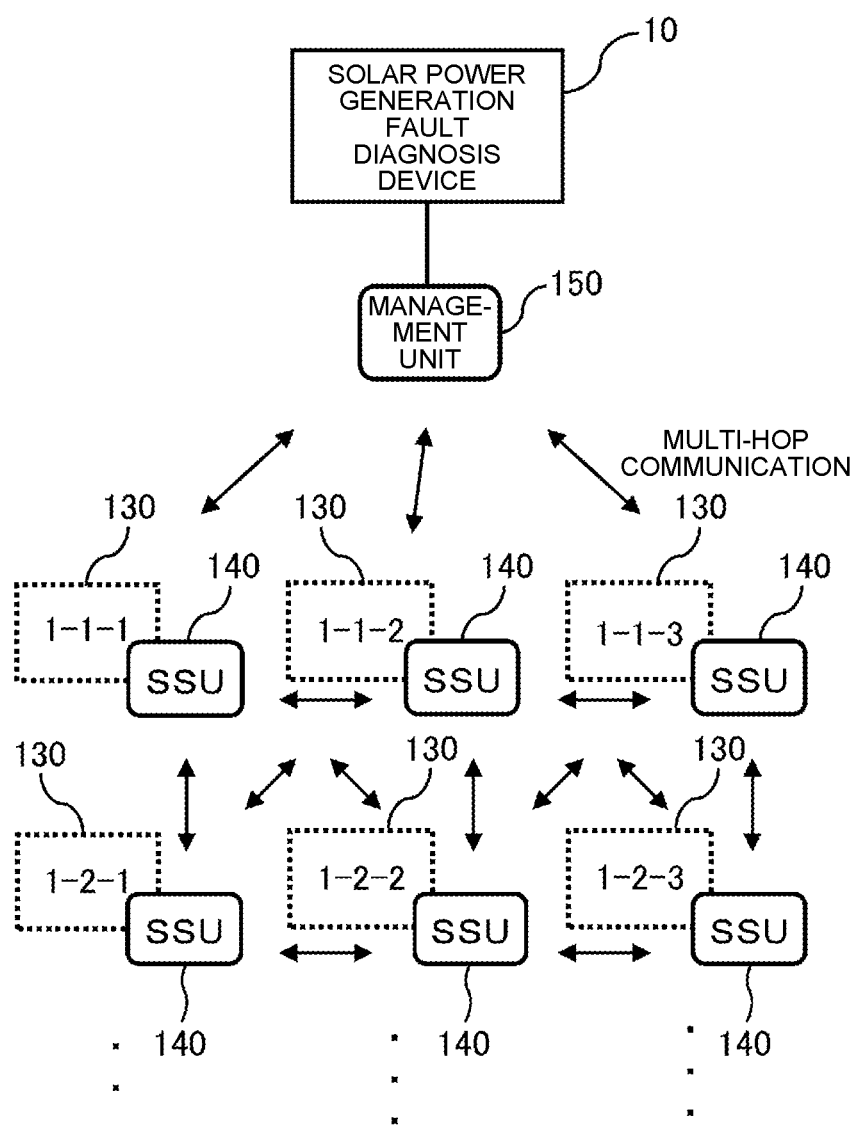
FIG. 3 is a diagram illustrating a concept of communication between string sensor units and a management unit.

The following describes a solar power generation system 100 that is a fault determination target of a solar power generation fault diagnosis device 10 with reference to FIGS. 1 to 3.

FIG. 1 is a diagram illustrating an exemplary configuration of the solar power generation system 100. As illustrated in FIG. 1, the solar power generation system 100 includes, for example, a power conditioning system (PCS) 110, junction boxes 120, strings 130 each including a plurality of solar panels 131, string sensor units (SSUs) 140, a management unit (MU) 150, and a network device (NW) 160.

The power conditioning system 110 converts direct current transmitted from the junction boxes 120 into alternating current. The electric power output from the power conditioning system 110 is supplied to an electrical grid.

Each junction box 120 is electrically connected to a plurality of strings 130. The direct current transmitted from the strings 130 is transmitted to the power conditioning system 110 via the junction box 120.

Each string 130 is a unit of a plurality of solar panels 131 that are connected in series. In FIGS. 1 to 19, the strings 130 are indicated by numerals such as "1-1-1" and these numerals are string IDs that are identifiers for uniquely identifying the strings 130. In the following description, for example, a string 130 indicated by a numeral "1-1-1" is described as a "1-1-1 string 130". Each solar panel 131 includes a plurality of solar panels that are arranged in a planar array with light-receiving surfaces facing upward and the surfaces being protected by resin or reinforced glass.

Each string sensor unit 140 measures or calculates the electric current, voltage, or impedance (hereinafter referred to as an "electrical quantity") of a certain string 130, and has a function of communicating wirelessly with other string sensor units 140 and the management unit 150. FIG. 2 is a diagram illustrating how a string sensor unit 140 is connected to a string 130. As illustrated in FIG. 2, the string sensor unit 140 is connected to a plurality of solar panels that are connected in series. This configuration allows the string sensor unit 140 to measure the electric current flowing in the string 130 or the voltage across the string 130. A first communication device 144 in the string sensor unit 140 transmits quantity information indicating the measured electrical quantity to the management unit 150. The detailed configuration of the string sensor unit 140 will be described later.

The management unit 150 transfers the quantity information received from the string sensor unit 140 to the solar power generation fault diagnosis device 10 via the network device 160. The detailed configuration of the management unit 150 will be described later.

The management unit 150 configures, for example, a multi-hop wireless communication network (hereinafter referred to as a "multi-hop network") with the string sensor units 140. The multi-hop network uses, for example, 2.4 GHz or 920 MHz frequency band radio waves and communicates in compliance with wireless communication standards such as IEEE 802.15.4. The frequency bands and the wireless communication standards are optimally selected as appropriate in accordance with, for example, the achievable range of the radio waves or the distance between the adjacent string sensor units 140. The network topology of the multi-hop network may be, but not limited to, for example, a tree topology that connects the string sensor units 140 in a hierarchy with the management unit 150 serving as a router or a star topology that directly connects the string sensor units 140 to the management unit 150.

FIG. 3 is a diagram illustrating a concept of communication between the string sensor units 140 and the management unit 150. As illustrated in FIG. 3, to implement the multi-hop network, the management unit 150 and the string sensor units 140 are given a management unit ID and string sensor unit IDs by which the management unit 150 and the string sensor units 140 are uniquely identified in the multi-hop network. The management unit ID and the string sensor unit IDs are, for example, unique physical addresses such as MAC addresses assigned to the management unit 150 and the string sensor units 140. The management unit 150 and the string sensor units 140 store therein, respectively, the management unit ID and string sensor unit IDs assigned thereto.

Although, in the present embodiment, the management unit 150 and the string sensor units 140 communicate wirelessly, they may configure a wired communication network by using communication cables such as optical cables.

The network device 160 connects the management unit 150 with a network 170. The network device 160 is a wired or wireless repeater such as a switching hub and a router. The network 170 is, for example, the Internet or a leased line. The solar power generation fault diagnosis device 10 is communicably connected with the network device 160 via the network 170. The network device 160 may be, for example, a power plant monitor device or a surveillance camera having a repeater function.

In the description above, the solar power generation fault diagnosis device 10 is connected to the management unit 150 via the network 170 and the network device 160, but the configuration is not limited to this. In the solar power generation system 100, for example, the solar power generation fault diagnosis device 10 may be configured to receive the quantity information directly from the management unit 150, not via the network 170 or the network device 160. In this case, the solar power generation fault diagnosis device 10 is disposed in, for example, an enclosure 180. If so, the communication scheme is not limited to a wireless network and may be a wired network using communication cables such as optical cables.

The following describes detailed configurations of the string sensor units 140, the management unit 150, and the solar power generation fault diagnosis device 10 according to the present embodiment.

Configuration of String Sensor Units 140

Figure 4:
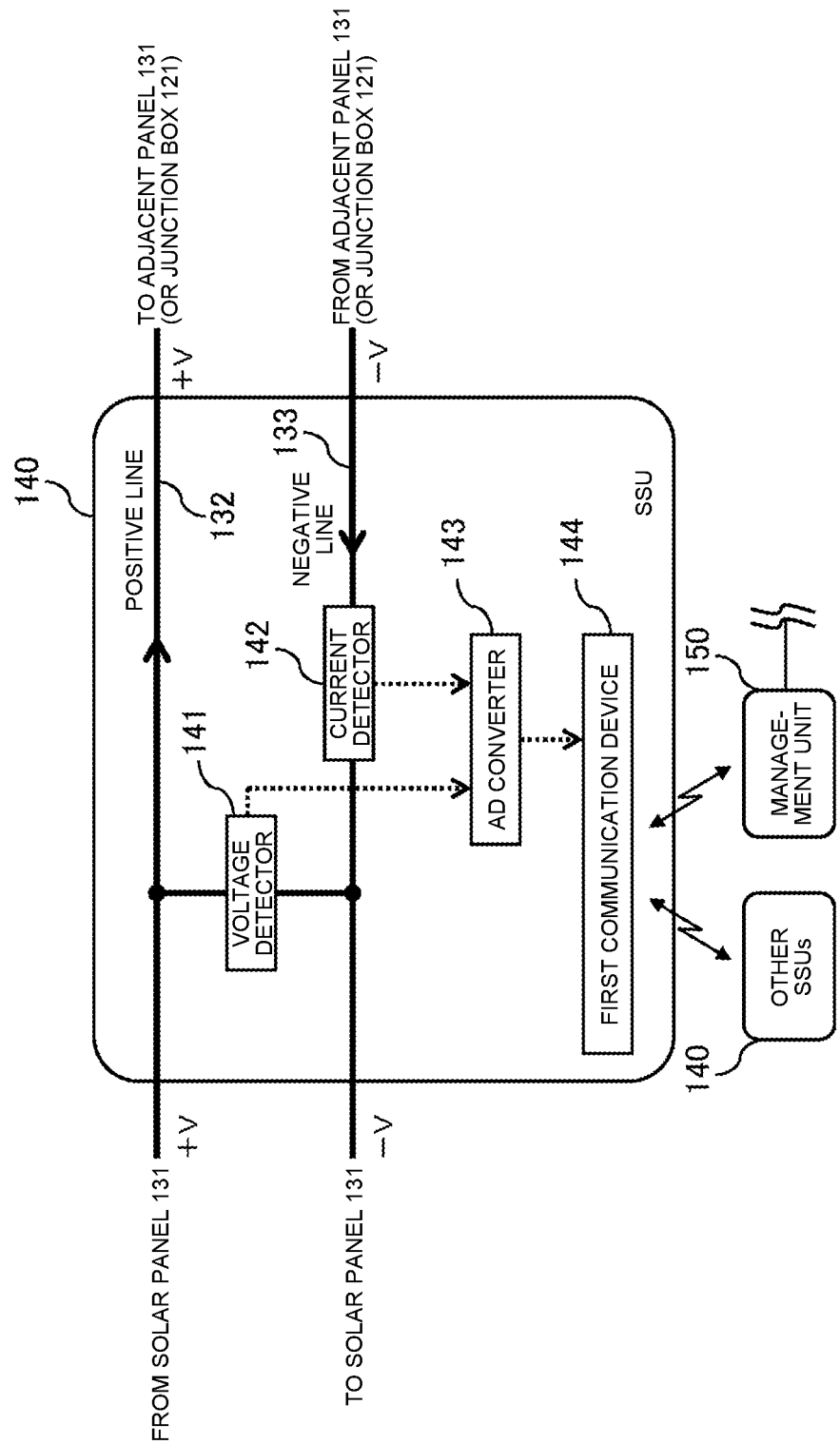
FIG. 4 is a diagram illustrating an exemplary configuration of a string sensor unit.
Figure 5:
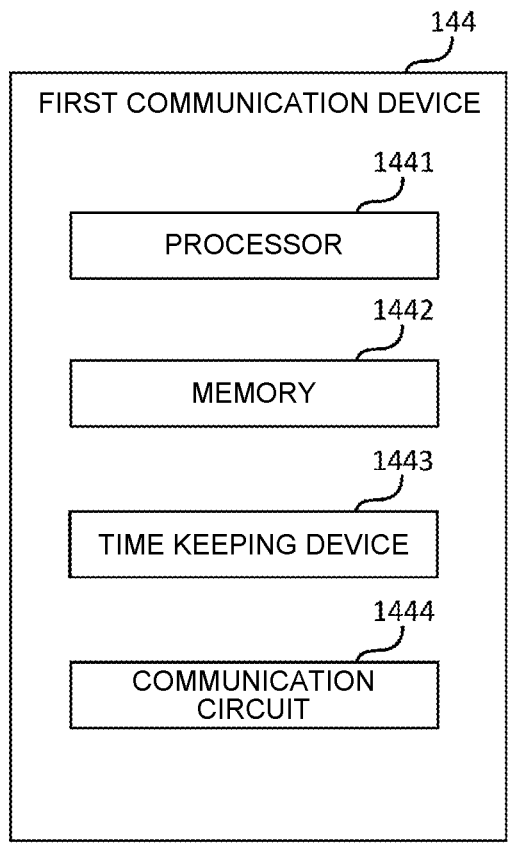
FIG. 5 is a diagram illustrating an exemplary hardware configuration of a first communication device.
Figure 6:
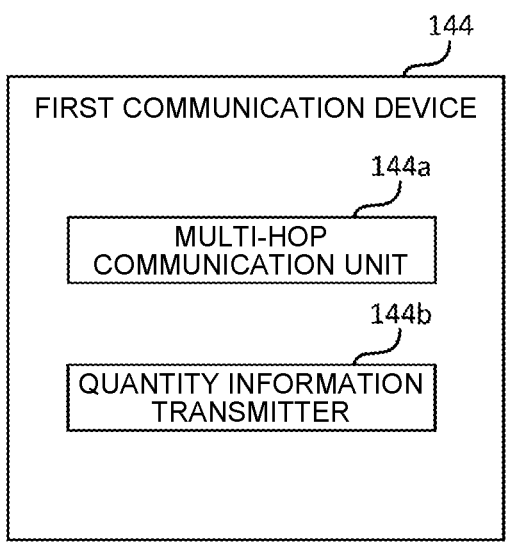
FIG. 6 is a diagram illustrating an exemplary software configuration of the first communication device.

The following describes the string sensor units 140 with reference to FIGS. 4, 5, and 6.

FIG. 4 is a diagram illustrating an exemplary configuration of a string sensor unit 140. As illustrated in FIG. 4, the string sensor unit 140 includes a voltage detector 141, a current detector 142, an AD converter 143, and the first communication device 144. The string sensor unit 140 receives driving power from a current line (positive line and negative line) of the string 130. The string sensor unit 140 may include an auxiliary power source for emergency.

The voltage detector 141 is provided to measure a voltage value between, for example, the positive line and the negative line of the current line. The voltage detector 141 has a circuit that, for example, amplifies the measured voltage value (analog signal) and outputs the amplified voltage value to the AD converter 143.

The current detector 142 includes, for example, an element that detects electric current flowing in the current line and a circuit that amplifies the detected current value (analog signal) and outputs the amplified current value to the AD converter 143.

The AD converter 143 converts analog signals indicating electrical quantities (voltage value, electric current value) input from the voltage detector 141 and the current detector 142 into digital signals and outputs the digital signals to the first communication device 144.

The first communication device 144 communicates with the management unit 150 and the other string sensor units 140 via the multi-hop network. FIG. 5 is a diagram illustrating an exemplary hardware configuration of the first communication device 144. As illustrated in FIG. 5, the first communication device 144 has a hardware configuration including a processor 1441, a memory 1442, a time keeping device 1443, and a communication circuit 1444. The processor 1441 is, for example, a micro processing unit (MPU) and a central processing unit (CPU). The memory 1442 is, for example, a random-access memory (RAM), a read only memory (ROM), and a non-volatile RAM (NVRAM). The processor 1441 and the memory 1442 provide a function of an information processing device to the first communication device 144. The memory 1442 stores therein computer programs such as firmware and data. The time keeping device 1443 includes, for example, a real time clock (RTC), and is configured to output time information. The communication circuit 1444 includes, for example, a high-frequency amplifier, a modulation and demodulation circuit (e.g., a frequency converter, a filter circuit, an oscillation circuit, a quadrature demodulator, and a quadrature modulator), an AD converter, and a DA converter.

FIG. 6 is a diagram illustrating an exemplary software configuration of the first communication device 144. As illustrated in FIG. 6, the first communication device 144 has a software configuration that can implement functions of a multi-hop communication unit 144$a$ and a quantity information transmitter 144$b$. These functions are implemented such that, for example, the processor 1441 of the first communication device 144 reads and executes a computer program stored in the memory 1442. These functions may be implemented by, for example, hardware such as an application specific integration circuit (ASIC).

The multi-hop communication unit 144$a$ is a function of communicating with other string sensor units 140 and the management unit 150 via the multi-hop network. The multi-hop communication unit 144$a$ has functions for use in communication, such as a routing function, an access control function, a channel estimation/allocation function, an error control function, a flow control function, a congestion control function, and a quality of service (QoS) management function. When, for example, the multi-hop communication unit 144$a$ receives a packet having a destination address not of its own via the multi-hop network, the multi-hop communication unit 144$a$ uses the routing function to select a route and transfers the received packet to other string sensor units 140 or the management unit 150 on the selected route.

The quantity information transmitter 144$b$ is a function of transmitting the electrical quantities input from the AD converter 143 to the management unit 150 via the multi-hop network as quantity information. The quantity information transmitter 144$b$ transmits the quantity information to the management unit 150 at certain intervals (e.g., at every 60 seconds).

Configuration of Management Unit 150

Figure 7:
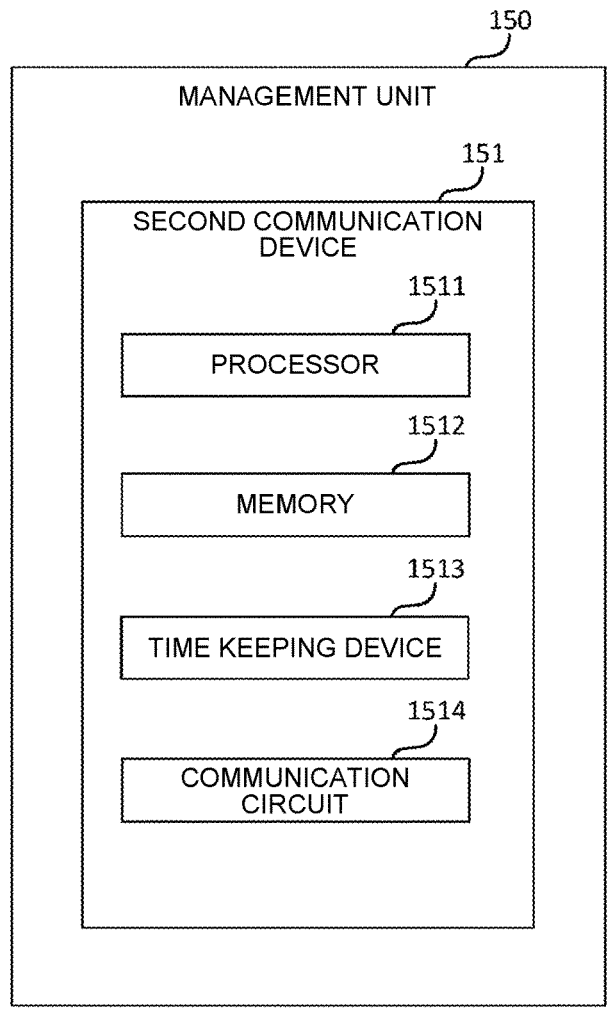
FIG. 7 is a diagram illustrating an exemplary hardware configuration of the management unit.
Figure 8:
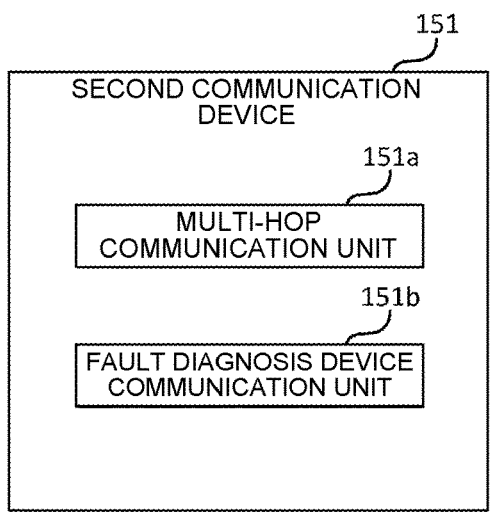
FIG. 8 is a diagram illustrating an exemplary software configuration of a second communication device.

The following describes the management unit 150 with reference to FIGS. 7 and 8.

FIG. 7 is a diagram illustrating an exemplary hardware configuration of the management unit 150. As illustrated in FIG. 7, the management unit 150 includes a second communication device 151. The second communication device 151 includes an interface such as a wireless LAN adapter or a network interface card (NIC) for connection to the network 170, and is connected to the network 170 via the network device 160. The second communication device 151 communicates with the string sensor units 140 via the multi-hop network.

As illustrated in FIG. 7, the second communication device 151 has a hardware configuration including a processor 1511, a memory 1512, a time keeping device 1513, and a communication circuit 1514. These components have the same configurations as those of the first communication device 144 and thus are not described herein.

FIG. 8 is a diagram illustrating an exemplary software configuration of the second communication device 151. As illustrated in FIG. 8, the second communication device 151 has a software configuration that can implement functions of a multi-hop communication unit 151$a$ and a fault diagnosis device communication unit 151$b$. These functions are implemented such that, for example, the processor 1511 of the second communication device 151 reads and executes a computer program stored in the memory 1512. These functions may be implemented by, for example, hardware such as an ASIC.

The multi-hop communication unit 151$a$ is a function of communicating with the string sensor units 140 via the multi-hop network. The multi-hop communication unit 151$a$ has functions for use in communication, such as a routing function, an access control function, a channel estimation/allocation function, an error control function, a flow control function, a congestion control function, and a QoS management function. The fault diagnosis device communication unit 151$b$ is a function of communicating with the solar power generation fault diagnosis device 10 via the network device 160.

Configuration of Solar Power Generation Fault Diagnosis Device 10

The following describes a configuration of the solar power generation fault diagnosis device 10 with reference to FIGS. 9 to 19.

The solar power generation fault diagnosis device 10 determines a fault of the strings 130 in the solar power generation system 100. In the following description, the solar power generation fault diagnosis device 10 performs the fault determination for each string including a plurality of solar panels 131, but the fault determination is not limited to this. For example, the solar power generation fault diagnosis device 10 may perform the fault determination for each solar panel 131 included in the strings 130, for each junction box 120, or for each power conditioning system 110. In that case, the word string 130 in the following description is replaced with the solar panel 131, the junction box 120, the collector, or the power conditioning system 110 to implement the configuration.

Figure 9:
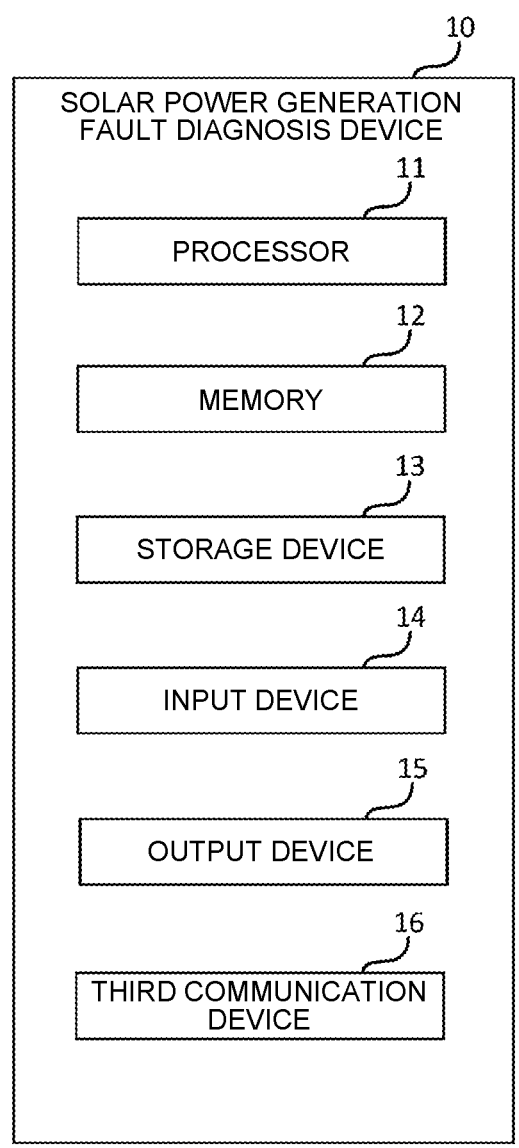
FIG. 9 is a diagram illustrating an exemplary hardware configuration of a solar power generation fault diagnosis device.

FIG. 9 is a diagram illustrating an exemplary hardware configuration of the solar power generation fault diagnosis device 10. As illustrated in FIG. 9, the solar power generation fault diagnosis device 10 has a hardware configuration including a processor 11 (one or more processors), a memory 12, a storage device 13, an input device 14, an output device 15, and a third communication device 16. The processor 11 is, for example, an MPU and a CPU. The memory 12 is, for example, a RAM, a ROM, and an NVRAM. The storage device 13 is, for example, a RAM, a ROM, and an NVRAM. The input device 14 is a user interface configured to receive an input operation from a user, and is, for example, an operation input device (e.g., keyboard, mouse, touch panel) and a sound input device (e.g., microphone). The output device 15 is a user interface configured to provide various types of information to the user, and is, for example, a display device (e.g., liquid crystal monitor) and a sound output device (e.g., speaker). The third communication device 16 is an interface configured to connect the solar power generation fault diagnosis device 10 with the network 170, and is, for example, a wireless LAN adapter or an NIC.

FIG. 10 is a diagram illustrating an exemplary software configuration of the solar power generation fault diagnosis device 10. As illustrated in FIG. 10, the solar power generation fault diagnosis device 10 has a software configuration having functions of an acquisition unit 10$a$, a weather determination unit 10$b$, a calculation unit 10$c$, a low-pass filter unit 10$d$, and a fault determination unit 10$e$. Thus, rather than physical units, these units 10$a$ to 10$e$ are functions executed by the processor 11, and do not need to have separate physical entities or separate codes. These functions are implemented such that, for example, the processor 11 of the solar power generation fault diagnosis device 10 reads and executes a computer program stored in the memory 12 as shown in this embodiment. These functions may be implemented by, for example, hardware such as an ASIC as an example of the one or more processors to perform these functions. Alternatively, these functions may be implemented such that the processor 11 reads and executes a computer program stored in an external storage medium.

Although the functions of the solar power generation fault diagnosis device 10 illustrated in FIG. 10 seem to be implemented by a single information processing device (computer), the configuration of the functions is not limited to this. The functions may be, for example, distributed in and implemented by two or more information processing devices, such as processors. In the following description, in this embodiment, these functions are implemented by a single information processing device (i.e., the processor 11).

The solar power generation fault diagnosis device 10 has a function of storing, in storage tables, the quantity information input via the third communication device 16, various types of information calculated by the functions described above, and various types of information input from external devices (not illustrated).

Specifically, the solar power generation fault diagnosis device 10 stores, in the storage device 13, a weather table 10*f* that associates weather information with solar irradiance information as illustrated in, for example, FIG. 11, a string allocation management table 10*g* that associates string IDs with physical addresses (e.g., MAC addresses) of the string sensor units 140 as illustrated in, for example, FIG. 12, an electrical quantity table 10*h* that associates the string IDs with quantity information on the strings 130 as illustrated in, for example, FIG. 13, a deviation rate table 10*i* that associates the string IDs with deviation rate information indicating deviation rates at certain time as illustrated in, for example, FIG. 14, and a deviation rate learned value table 10*j* that associates the string IDs with deviation rate learned value information indicating the deviation rate learned values at certain time as illustrated in, for example, FIG. 15.

The following describes the functions of the solar power generation fault diagnosis device 10 in detail.

The acquisition unit 10*a* is a function of acquiring the quantity information indicating electrical quantities output from the strings 130. If there is a need for accessing a widely available database such as a meteorological agency database 200, the acquisition unit 10*a* has a function of acquiring certain information from the database. The information acquired by the acquisition unit 10*a* is used for implementing the functions of the solar power generation fault diagnosis device.

The weather determination unit 10*b* is a function of determining the weather at the current time at which fault determination on the strings 130 is performed. The weather determination unit 10*b* refers to the weather table 10*f* and determines the current weather based on, for example, the meteorological agency database 200 or based on the current solar irradiance information acquired from a pyranometer 190 disposed close to the solar power generation system 100. The weather determination unit 10*b* may determine the current weather by acquiring the weather information on the installation location of the solar power generation system 100 from, for example, the meteorological agency database 200 without using the weather table 10*f*. The weather to be determined may be indicated by at least "sunny" or "cloudy".

The calculation unit 10*c* is a function of calculating a deviation rate when, for example, the current weather is determined to be "sunny". The calculation unit 10*c* has a function of calculating the average of electrical quantity values of, for example, all the strings 130 (hereinafter referred to as the "entire strings 130") connected to a certain junction box 120 at certain time. As illustrated in FIG. 1, the entire strings 130 connected to a junction box 120 are, for example, 1-1-1 to 1-1-3 strings 130 connected to a junction box 121 or 1-2-1 to 1-2-3 strings 130 connected to a junction box 122. In the following description, the entire strings 130 indicate the 1-1-1 to 1-1-3 strings 130 connected to the junction box 121. The calculation unit 10*c* has a function of calculating the deviation rate based on an electrical quantity value of a certain string 130 and the average of the electrical quantity values of the entire strings 130. The electrical quantity value (electric current value, voltage value, or impedance value) for use in calculation of the calculation unit 10*c* is a value acquired from the electrical quantity table 10*h*.

Specifically, the calculation unit 10*c* calculates the deviation rate based on expression (1) below such that the calculation unit 10*c* divides an electrical quantity value of a certain string 130 by an average electrical quantity value of the entire strings 130 and subtracts the quotient from, for example, "1" and converts the resulting value to percentage.

$$\text{DEVIATION RATE (\%)} = \left(1 - \frac{\text{ELECTRICAL QUANTITY VALUE OF STRING 130}}{\left(\sum_{k=1}^{n} \text{ELECTRICAL QUANTITY VALUE OF } 1-1-k \text{ STRING 130}\right) \div n}\right) \times 100 \quad (1)$$

In expression (1), "n" represents the number of strings 130 connected to, for example, the junction box 121.

The solar power generation fault diagnosis device 10, however, does not necessarily use expression (1) above to calculate the deviation rate. The deviation rate may be a value calculated such that, for example, the electrical quantity value of the certain string 130 is divided by the average electrical quantity value of the entire strings 130 and the quotient is converted to percentage. Alternatively, for example, the deviation rate may be a value calculated such that the electrical quantity value of the certain string 130 is divided by the average electrical quantity value of the entire strings 130. In the following description, the deviation rate indicates a value calculated based on expression (1).

The calculation unit 10*c* stores, in the storage device 13, deviation rate information in association with the string IDs. Although, in FIG. 14, the deviation rate is calculated at every minute, the calculation interval is not limited to this, and may be set to any value.

Using the deviation rate in fault determination to be described later can increase the accuracy of the fault determination, since the use of the deviation rate calculated based on the average electrical quantity value allows for fault determination based on relative comparison using the deviation rate, not based on the absolute comparison of electrical quantity fluctuations of the strings 130 as performed by the device disclosed in Patent Document 1.

The deviation rate is an electric current deviation rate regarding the electric current value output from the strings 130, a voltage deviation rate regarding the voltage value output from the strings 130, or an impedance deviation rate regarding the impedance value output from the strings 130.

Specifically, the calculation unit 10*c* calculates the electric current deviation rate such that the calculation unit 10*c* divides an electric current value of a certain string 130 at certain time by an average current value that is the average of the electric current values of the entire strings 130 at the certain time and subtracts the quotient from "1" and converts the resulting value to percentage. In the same manner, the calculation unit 10c calculates the voltage deviation rate such that the calculation unit 10c divides a voltage value of a certain string 130 at certain time by an average voltage value that is the average of the voltage values of the entire strings 130 at the certain time and subtracts the quotient from "1" and converts the resulting value to percentage. In the same manner, the calculation unit 10c calculates the impedance deviation rate such that the calculation unit 10c divides an impedance value of a certain string 130 at certain time by an average impedance value that is the average of the impedance values of the entire strings 130 at the certain time and subtracts the quotient from "1" and converts the resulting value to percentage.

Figure 16:
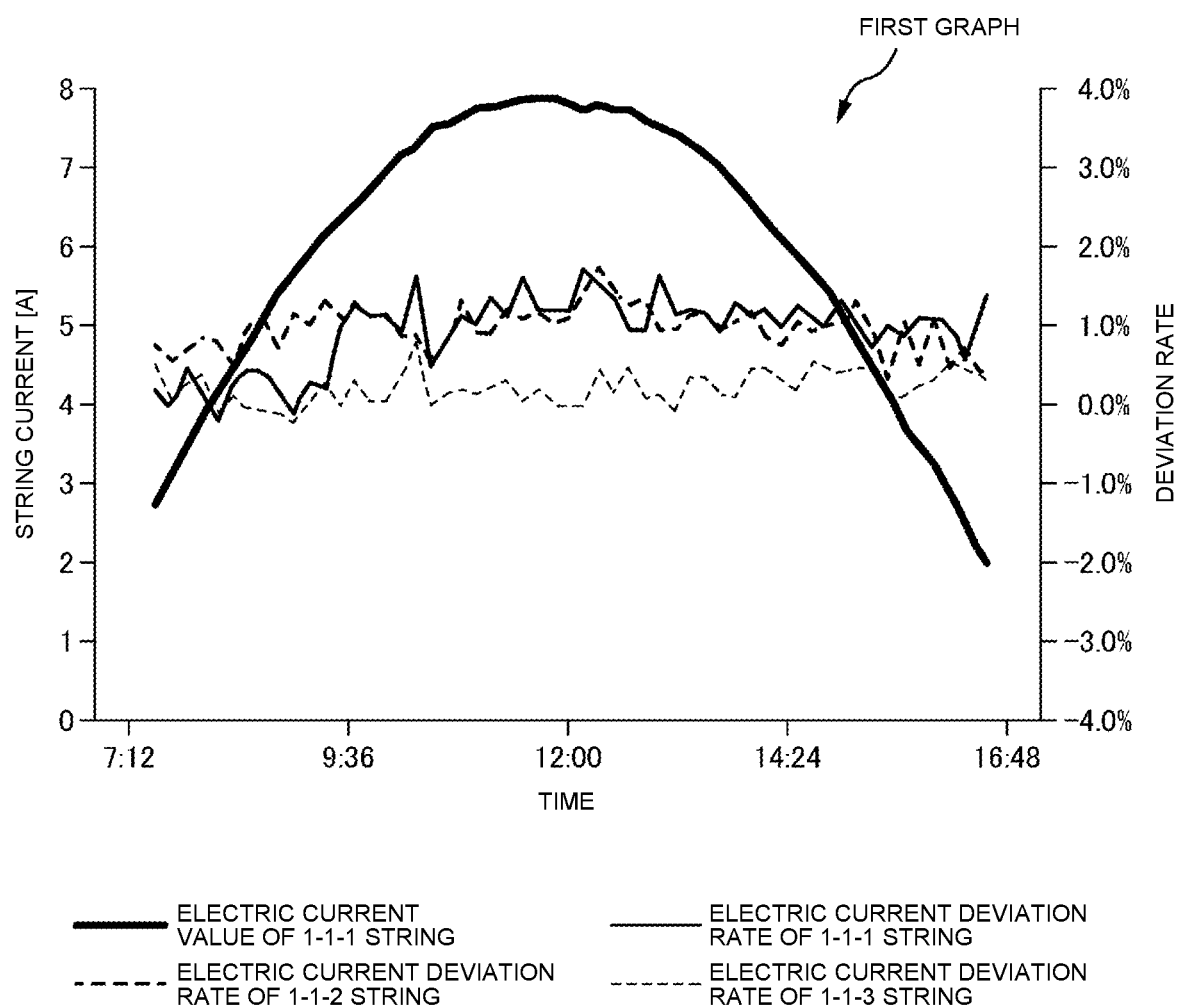
FIG. 16 is a first graph illustrating a relation between the electric current and the deviation rate of a string.

FIG. 16 is a first graph illustrating a relation between the string current and the electric current deviation rate of, for example, the 1-1-1 string 130. The electric current deviation rate is more specifically described with reference to FIG. 16. The calculation unit 10c divides the "1-1-1 string current" indicated by a bold sold line by the entire string current (not illustrated) at certain time to calculate the "1-1-1 string current deviation rate" indicated by a thin solid line. In the same manner, the "1-1-2 string current deviation rate" indicated by a bold dashed line and the "1-1-3 string current deviation rate" indicated by a thin dashed line are calculated. Although not illustrated, the voltage deviation rate and the impedance deviation rate are calculated in the same manner.

In the description above, the calculation unit 10c calculates the electric current deviation rate, the voltage deviation rate, and the impedance deviation rate by using the average electrical quantity value of the entire strings 130, but the calculation method is not limited to this. For example, the calculation unit 10c may calculate the deviation rates by using the median electrical quantity value of the entire strings 130, the mode electrical quantity value that is an electrical quantity value that occurs most frequently, or a specific average electrical quantity value that is an average of electrical quantity values excluding specific outliers from the electrical quantity values of the entire strings 130. This configuration allows the solar power generation fault diagnosis device 10 to adopt a calculation method in accordance with the installation location or the properties of the facility specifications of the solar power generation system 100, and thus can increase the accuracy of fault diagnosis.

The low-pass filter unit 10d is a function of implementing a low-pass filter. The low-pass filter unit 10d has a characteristic of allowing a deviation rate with small fluctuations to pass and blocking a deviation rate with large fluctuations compared to the deviation rate component with small fluctuations.

Specifically, it is preferred that the low-pass filter unit 10d is designed to absorb about one to two months of fluctuations of the deviation rate that is the input signal of the low-pass filter unit 10d. In other words, it is preferred to set, to about one to two months, the time (time constant) taken for a deviation rate learned value to reach 63% of a stable deviation rate learned value. The deviation rate learned value is the output signal of the low-pass filter unit 10d that receives the deviation rate as an input signal at its integral circuit that implements the function of the low-pass filter unit 10d.

As illustrated in FIG. 15, the low-pass filter unit 10d stores, in the storage device 13, deviation rate learned value information indicating the deviation rate learned values in association with the string IDs. Although, in FIG. 15, the deviation rate learned values are calculated at every 60 seconds, the calculation timing is not limited to this. The calculation timing is set in accordance with the calculation interval of the calculation unit 10c.

In one preferred embodiment, the low-pass filter unit 10d is an infinite impulse response (IIR) filter, but may be a finite impulse response (FIR) filter. Using the IIR filter can implement a high-performance filter design with fewer calculations. Using the FIR filter can achieve a stable control because all the poles are located at the origin. The function of the low-pass filter unit 10d may be implemented by hardware (analog circuit).

Figure 17:
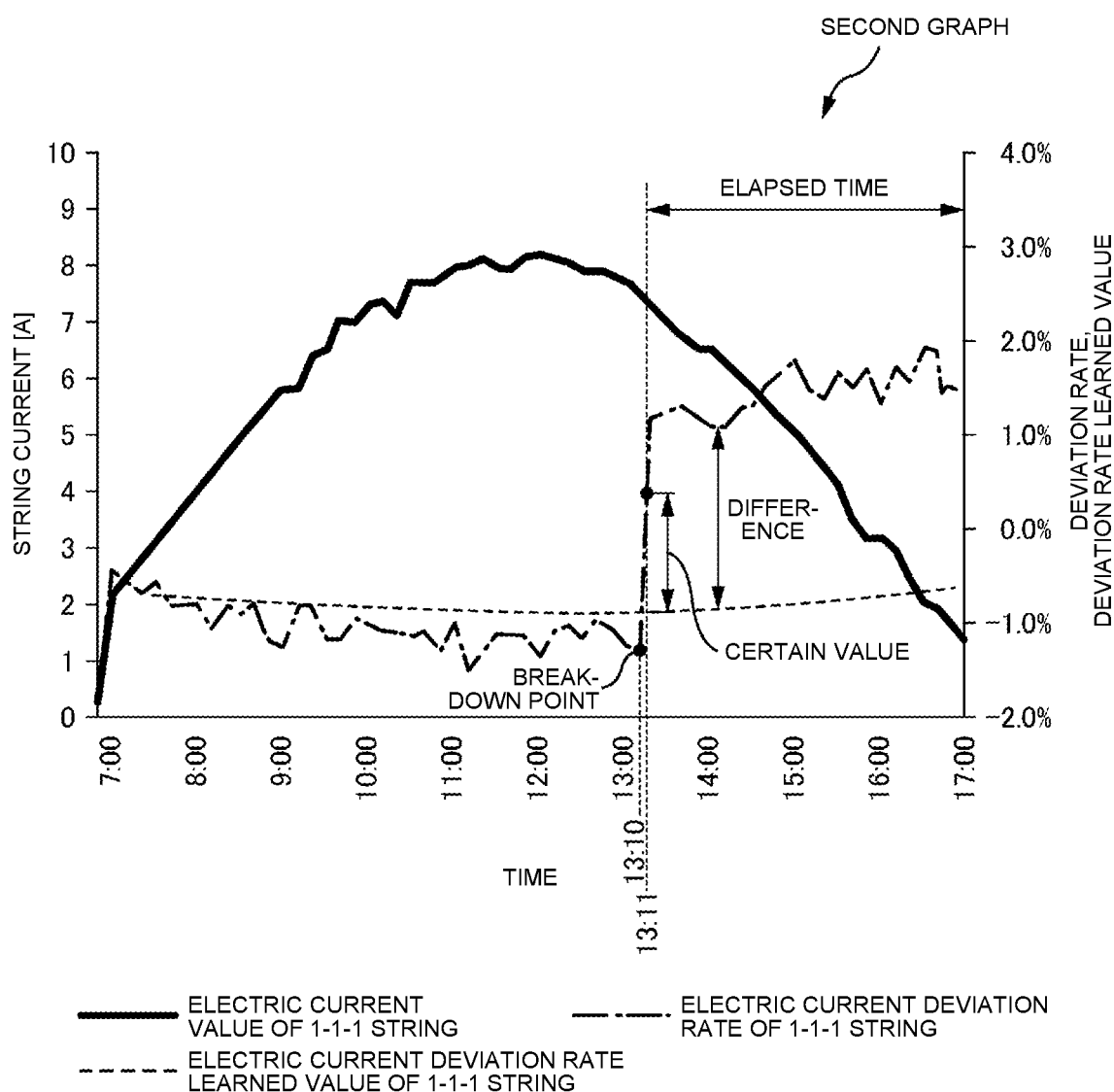
FIG. 17 is a second graph illustrating a relation between the deviation rate and the deviation rate learned value regarding electric current of the string.
Figure 18:
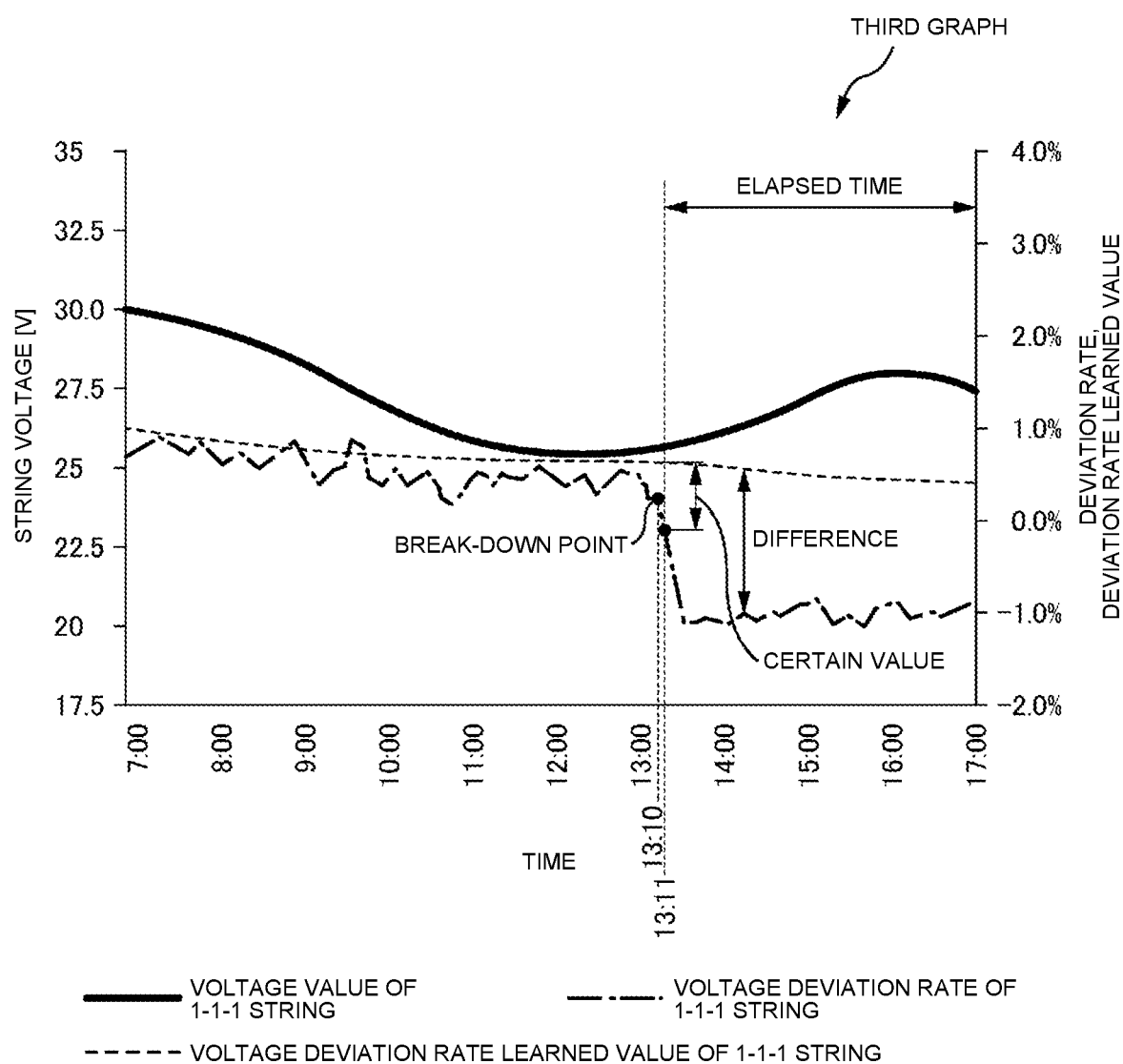
FIG. 18 is a third graph illustrating a relation between the deviation rate and the deviation rate learned value regarding voltage of the string.
Figure 19:
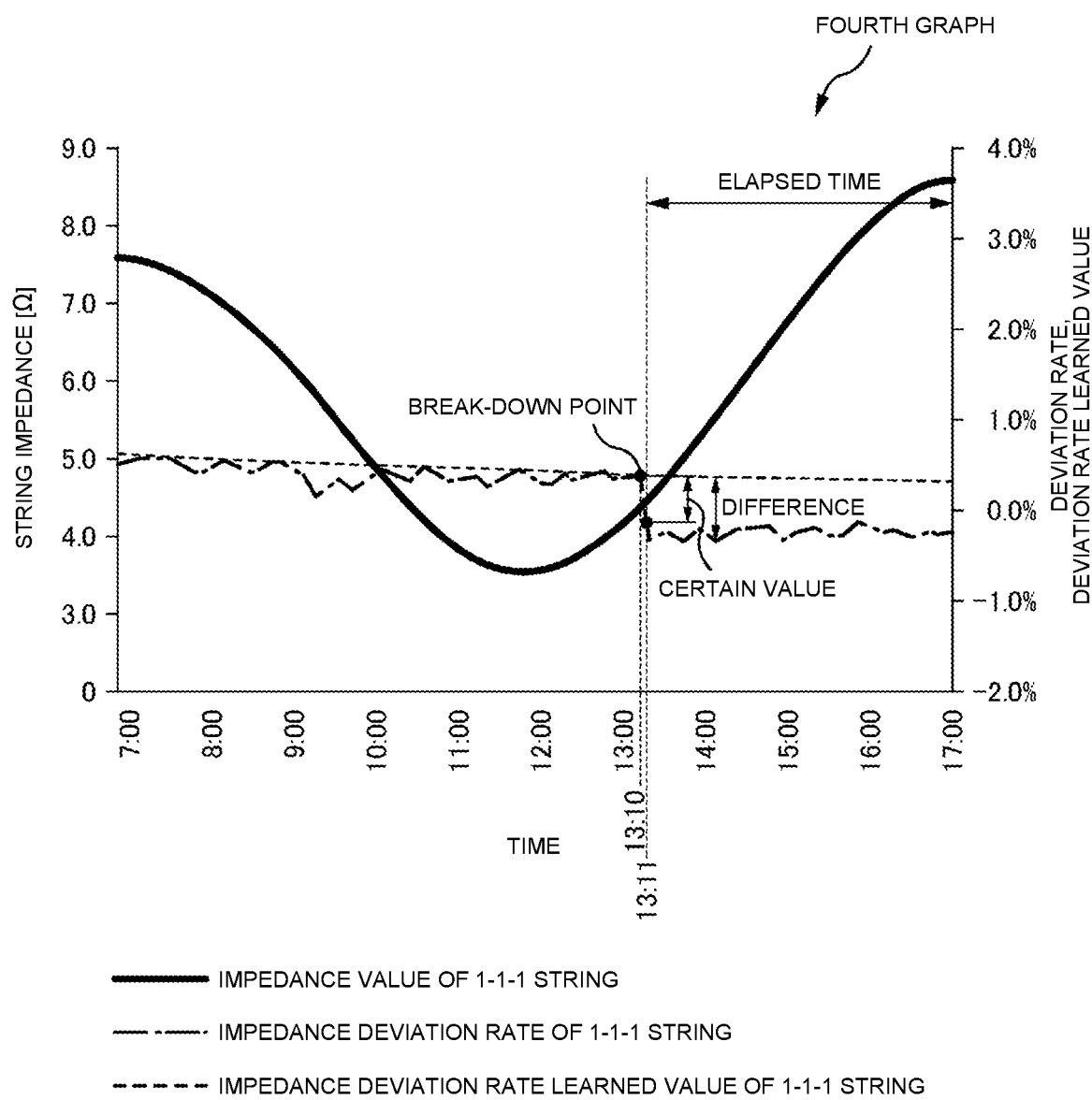
FIG. 19 is a fourth graph illustrating a relation between the deviation rate and the deviation rate learned value regarding impedance of the string.

FIG. 17 is a second graph illustrating a relation between the deviation rate and the deviation rate learned value regarding the electric current value of, for example, the 1-1-1 string 130. As illustrated in FIG. 17, the solar power generation fault diagnosis device 10 creates the second graph based on the deviation rate table 10i and the deviation rate learned value table 10j. As illustrated in the second graph, the electric current deviation rate (dash-dotted line) input to the low-pass filter unit 10d is output as the electric current deviation rate learned value (dashed line) having smaller fluctuations. FIG. 18 is a third graph illustrating a relation between the voltage deviation rate and the voltage deviation rate learned value regarding the voltage value of, for example, the 1-1-1 string 130. FIG. 19 is a fourth graph illustrating a relation between the impedance deviation rate and the impedance deviation rate learned value regarding the impedance of, for example, the 1-1-1 string 130. In the same manner as the electric current deviation rate illustrated in FIG. 17, the voltage deviation rate (dash-dotted line) illustrated in FIG. 18 and the impedance deviation rate (dash-dotted line) illustrated in FIG. 19 are output as the voltage deviation rate learned value (dashed line) and the impedance deviation rate learned value (dashed line), respectively.

Using the deviation rate learned value enables a suitable comparison for the fault determination to be described later without being affected by the variations in properties of each string 130.

The signal input to the low-pass filter unit 10d may be an electrical quantity value instead of a deviation rate. In this case, the low-pass filter unit 10d smoothly calibrates the fluctuations of the input electrical quantity value and outputs an electrical quantity learned value as the deviation rate learned value. This configuration allows the fault determination unit 10e, which will be described later, to determine a fault by using relative comparison in the same manner as the configuration of using the deviation rate.

The fault determination unit 10e is a function of determining whether the string 130 is faulty based on the deviation rate and the deviation rate learned value. The fault determination unit 10e determines whether the difference between the deviation rate and the deviation rate learned value is equal to or larger than a certain value or equal to or smaller than a certain value for a certain continuous time, and then determines the state of the string 130 based on the result of the determination. For ease of description below, the phrase "equal to or larger than a certain value or equal to or smaller than a certain value" is simply referred to as "equal to or larger than or smaller than a certain value". The difference is calculated by, for example, subtracting the deviation rate learned value from the deviation rate. The phrase "for a certain continuous time" means, for example, lasting for a certain time period of a day between the sunrise and the sunset and also means that the sum of a time period from the time at which the difference becomes equal to or larger than or smaller than a certain value to the sunset and a time period elapsed from the sunrise of the next day exceeds a certain time period.

The following specifically describes an example in which the sunrise is at 7:00, the sunset is at 17:00, and the fault determination unit 10e determines a fault of a string 130. Suppose that the certain time period is set to 4 hours. If it is determined that the difference at 15:00 is equal to or larger than or smaller than a certain value, the fault determination unit 10e determines that the difference is equal to or larger than or smaller than the certain value for 2 continuous hours from 15:00 to the sunset at 17:00, and determines that the difference is equal to or larger than or smaller than the certain value for 2 continuous hours from the sunrise at 7:00 to 9:00, the fault determination unit 10e determines that the difference is equal to or larger than or smaller than the certain value for 4 continuous hours (certain time period), and then determines that the string 130 is faulty.

Fault Determination Procedure of Solar Power Generation Fault Diagnosis Device 10

Figure 20:
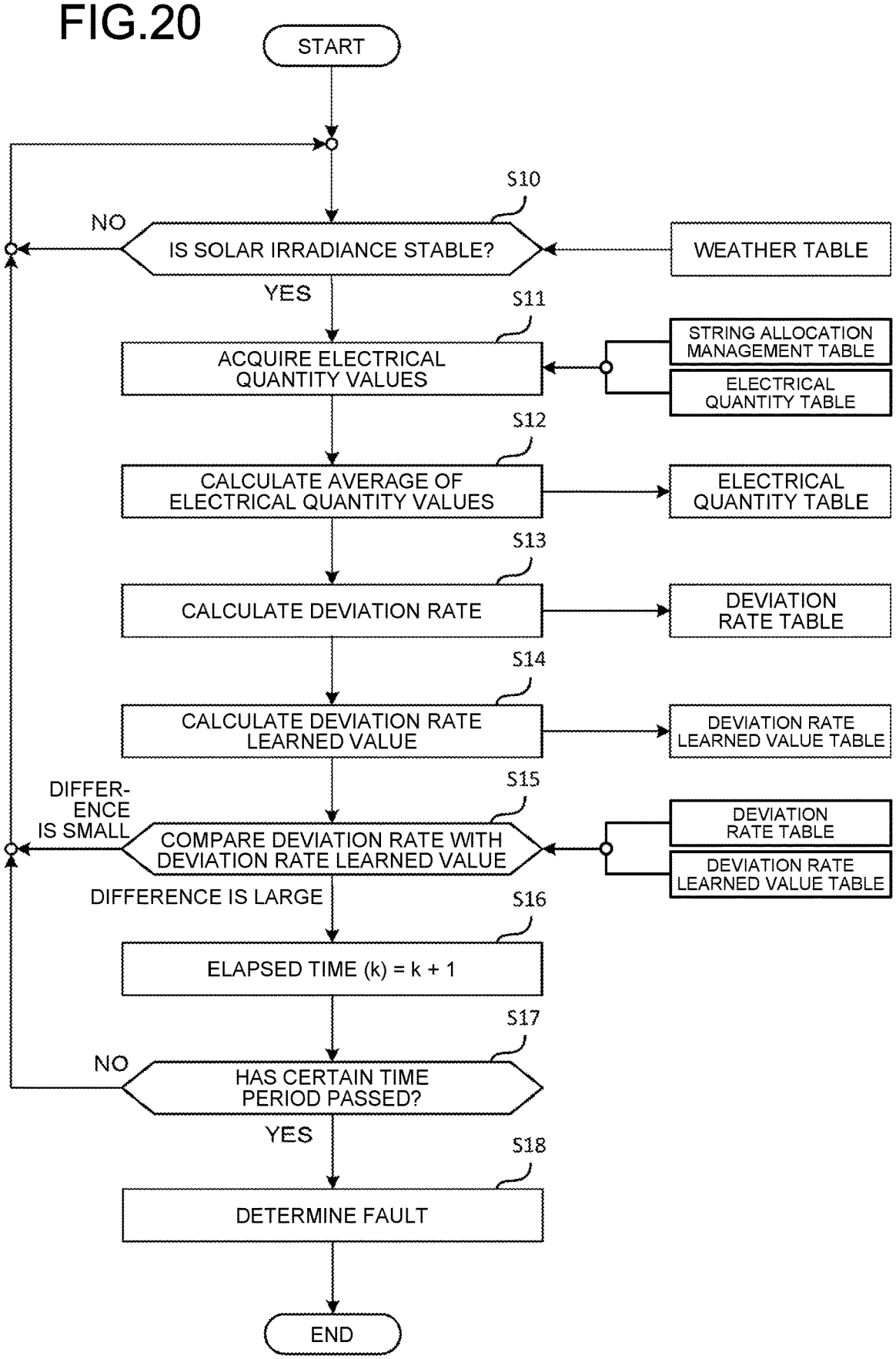
FIG. 20 is a flowchart illustrating the procedure of fault determination of the solar power generation fault diagnosis device.

FIG. 20 is a flowchart illustrating the procedure of fault determination of the solar power generation fault diagnosis device 10. The following describes the fault determination procedure of the solar power generation fault diagnosis device 10 with reference to FIG. 20. In the following description, a sentence that begins with a certain function means that the processor 11 reads a computer program and implements the certain function.

The acquisition unit 10a acquires quantity information of the strings 130 via the third communication device 16. The acquisition unit 10a acquires various types of information from other devices such as the database of the meteorological agency and the pyranometer 190. The acquisition unit 10a stores the acquired quantity information and various types of information in the storage device 13 in association with the string IDs.

First, the weather determination unit 10b determines the weather based on the weather table 10f and the solar irradiance information acquired from the pyranometer 190 (S10). Specifically, when the solar irradiance is equal to or larger than a certain value, the weather determination unit 10b determines that the weather is "sunny" and when the solar irradiance is smaller than the certain value, the weather determination unit 10b determines that the weather is "cloudy". If the weather determination unit 10b determines that the weather is "cloudy" (No at S10), the weather determination unit 10b determines the weather again. If the weather determination unit 10b determines that the weather is "sunny" (Yes at S10), the weather determination unit 10b determines that the solar irradiance is stable and the process proceeds to the next process.

The calculation unit 10c acquires, from the storage device 13, the string IDs and the quantity information associated with the string IDs (S11).

The calculation unit 10c then calculates the average electrical quantity value at the current time. Specifically, for example, the calculation unit 10c calculates the average of the sum of the electrical quantity values of the entire strings 130 connected to the junction box 120 to which the target string 130 of the fault determination is connected (S12). The calculated average electrical quantity value is stored in the electrical quantity table 10h of the storage device 13.

The calculation unit 10c calculates the deviation rate such that the calculation unit 10c divides the electrical quantity value of the target string 130 of the fault determination by the average electrical quantity value of the entire strings 130 and subtracts the quotient from "1" and converts the resulting value to percentage (S13). The calculation unit 10c then stores deviation rate information indicating the calculated deviation rate in the deviation rate table 10i in the storage device 13.

The low-pass filter unit 10d receives the deviation rate information calculated by the calculation unit 10c as an input signal and outputs a deviation rate learned value (S14). The low-pass filter unit 10d then stores deviation rate learned value information indicating the output deviation rate learned value in the deviation rate learned value table 10j in the storage device 13.

The fault determination unit 10e compares the deviation rate with the deviation rate learned value at certain time (S15). If the absolute value of the difference between the deviation rate and the deviation rate learned value is smaller than a certain value (difference is small at S15), the fault determination unit 10e determines that the target string 130 is not faulty and the process proceeds to S10. If the absolute value of the difference between the deviation rate and the deviation rate learned value is equal to or larger than the certain value (difference is large at S15), the fault determination unit 10e increments an elapsed time variable relating to the elapsed time (S16). The fault determination unit 10e compares the elapsed time variable with the certain time period (S17). When, for example, the fault determination unit 10e is configured to determine whether the elapsed time exceeds 4 hours, the certain time period is set to a value of "240" corresponding to 4 hours converted into minutes.

Described next is a detailed procedure of determining the elapsed time with reference to FIGS. 17 to 19. In this procedure, the electric current deviation rate, the voltage deviation rate, and the impedance deviation rate are compared with the electric current deviation rate learned value, the voltage deviation rate learned value, and the impedance deviation rate learned value, respectively.

The second graph in FIG. 17 illustrates, for example, the electric current value of the 1-1-1 string 130 with a solid line, the electric current deviation rate with a dash-dotted line, and the electric current deviation rate learned value with a dashed line, and indicates that the string 130 broke down at 13:10. When a certain string 130 breaks down, the electric current value of the string 130 increases. In other words, the electric current value of the string 130 increases relative to the average current value of the entire strings 130. In this regard, the electric current deviation rate, which is calculated by dividing the electric current value of the string 130 by the average current value, increases. Specifically, in FIG. 17, the electric current deviation rate increases from about "−1.0%" to "+1.0%".

As illustrated in FIG. 17, there is no appreciable increase in the electric current deviation rate learned value, which is output from the low-pass filter unit 10d that receives the electric current deviation rate as an input signal. Using the electric current deviation rate learned value allows for a suitable comparison that can prevent fault determination errors caused by the variations of intrinsic properties of the strings 130. Specifically, for example, suppose that a string 130 is a string that outputs a relatively low electric current value. If this electric current value is compared with the average current value of the entire strings 130 on an absolute basis, a large difference between the electric current value and the average current value may be detected and the string 130 may be determined to be faulty. However, comparing the electric current deviation rate with the electric current deviation rate learned value, which is an electric current deviation rate with smaller fluctuations, can achieve a fault determination on the string 130 without being affected by the variations of the intrinsic properties of the strings.

The fault determination unit 10e determines whether the difference calculated by subtracting the electric current deviation rate learned value from the electric current deviation rate is equal to or larger than a certain value. If the difference is equal to or larger than the certain value for a certain time period, the fault determination unit 10e determines that the string is faulty. Specifically, when the certain value is set to, for example, "1.0", the difference in FIG. 17 is equal to or larger than the certain value (1.0) at 13:11, at which the fault determination unit 10e starts measuring the elapsed time.

The third graph in FIG. 18 illustrates, for example, the voltage value of the 1-1-1 string 130 with a solid line, the voltage deviation rate with a dash-dotted line, and the voltage deviation rate learned value with a dashed line, and indicates that the string 130 broke down at 13:10. When a certain string 130 breaks down, the voltage value of the string 130 decreases. In other words, the voltage value of the string 130 decreases relative to the average voltage value of the entire strings 130. In this regard, the voltage deviation rate, which is calculated by dividing the voltage value of the string 130 by the average voltage value, decreases. Specifically, in FIG. 18, the voltage deviation rate decreases from about "0.0%" to "−1.0%".

As illustrated in FIG. 18, there is no appreciable increase in the voltage deviation rate learned value, which is output from the low-pass filter unit 10d that receives the voltage deviation rate as an input signal. The reason why the voltage deviation rate learned value is used is the same reason as why the electric current deviation rate learned value is used, and thus is not described herein.

The fault determination unit 10e determines whether the difference calculated by subtracting the voltage deviation rate learned value from the voltage deviation rate is equal to or smaller than a certain value. If the difference is equal to or smaller than the certain value for a certain time period, the fault determination unit 10e determines that the string is faulty. Specifically, when the certain value is set to, for example, "0.5", the difference in FIG. 18 is equal to or smaller than the certain value (0.5) at 13:11, at which the fault determination unit 10e starts measuring the elapsed time.

The fourth graph in FIG. 19 illustrates, for example, the impedance value of the 1-1-1 string 130 with a solid line, the impedance deviation rate with a dash-dotted line, and the impedance deviation rate learned value with a dashed line, and indicates that the string 130 broke down at 13:10. When a certain string 130 breaks down, the impedance value of the string 130 decreases. In other words, the impedance value of the string 130 decreases relative to the average impedance value of the entire strings 130. Thus, the impedance deviation rate, which is calculated by dividing the impedance value of the string 130 by the average impedance value, decreases. Specifically, in FIG. 19, the impedance deviation rate decreases from about "0.0%" to "−1.0%".

As illustrated in FIG. 19, there is no appreciable increase in the impedance deviation rate learned value, which is output from the low-pass filter unit 10d that receives the impedance deviation rate as an input signal. The reason why the impedance deviation rate learned value is used is the same reason as why the electric current deviation rate learned value is used, and thus is not described herein.

The fault determination unit 10e determines whether the difference calculated by subtracting the impedance deviation rate learned value from the impedance deviation rate is equal to or smaller than a certain value. If the difference is equal to or smaller than the certain value for a certain time period, the fault determination unit 10e determines that the string is faulty. Specifically, when the certain value is set to, for example, "0.5", the difference in FIG. 19 is equal to or smaller than the certain value (0.5) at 13:11 at which the fault determination unit 10e starts measuring the elapsed time.

If the fault determination unit 10e determines, from the result of the measurement of the elapsed time, that the elapsed time has not reached or exceeded the certain time period (No at S17), the fault determination unit 10e determines that the string 130 is not faulty and the process proceeds to S10.

If the fault determination unit 10e determines that the elapsed time has reached or exceeded the certain time period (Yes at S17), the fault determination unit 10e determines that the string 130 is faulty (S18). The solar power generation fault diagnosis device 10 outputs a fault signal indicating that the string 130 is faulty to the output device 15.

Although, in the description above, the fault determination unit 10e determines a fault of the string 130 based on the deviation rate and the deviation rate learned value, the fault determination is not necessarily based on them. For example, the fault determination unit 10e may determine the fault of the string 130 based on the electrical quantity value and the electrical quantity learned value.

SUMMARY

As described above, the solar power generation fault diagnosis device 10 according to the present embodiment includes the acquisition unit 10a configured to acquire quantity information indicating an electrical quantity output from a string 130 (solar cell), the calculation unit 10c configured to calculate a deviation rate (first quantity value) relating to the electrical quantity based on the quantity information, the low-pass filter unit 10d configured to output a deviation rate learned value (second quantity value) from the deviation rate (first quantity value), and the fault determination unit 10e configured to determine the state of the string 130 (solar cell) based on the result of comparison between the deviation rate (first quantity value) and the deviation rate learned value (second quantity value). The solar power generation fault diagnosis device 10 according to the present embodiment determines the fault of the string 130 by relative comparison between the deviation rate and the deviation rate learned value, and this configuration can determine the fault more accurately than the fault determination based on the absolute comparison between an electrical quantity value and a certain value.

The fault determination unit 10e of the solar power generation fault diagnosis device 10 according to the present embodiment determines that the string 130 (solar cell) is in a faulty state when the fault determination unit 10e continuously determines that the difference between the deviation rate (first quantity value) and the deviation rate learned value (second quantity value) is equal to or larger than or smaller than a certain value for a certain time period. According to the present embodiment, a short-term change in the electrical quantity value caused by shadows or clouds is not determined to be a fault of the string 130, and thus the accuracy of fault determination can be increased.

The calculation unit 10c of the solar power generation fault diagnosis device 10 according to the present embodiment divides the electric current value, the voltage value, or the impedance value of the string 130 by the average, the median, the mode, or a specific average of the electric current values, the voltage values, or the impedance values of the entire strings 130, and based on the result of the division, the calculation unit 10c calculates the electric current deviation rate, the voltage deviation rate, or the impedance deviation rate. This configuration allows the solar power generation fault diagnosis device 10 to adopt a calculation method in accordance with the installation location or the properties of the facility specifications of the solar power generation system 100, and thus can increase the accuracy of fault diagnosis.

According to the present invention, a problem of catching the output variations attributable to the installation environment or intrinsic properties of a solar power generation system and determining that the system is faulty can be prevented.

The embodiment above is presented to facilitate the understanding of the present invention, and is not presented to limit the present invention. Various modifications and improvements may be made without departing from the scope of the present invention and their equivalents are included in the scope of the present invention.

What is claimed is:

1. A solar power generation fault diagnosis device, comprising one or more processors configured to perform the following:
   receiving signals indicating an electrical quantity output from a solar cell to acquire quantity information indicating the electrical quantity output from the solar cell;
   calculating a first quantity value relating to the electrical quantity based on the quantity information;
   implementing a low-pass filter unit so as to output a second quantity value from the first quantity value;
   determining a state of the solar cell based on a result of comparison between the first quantity value and the second quantity value; and
   outputting the determined state of the solar cell;
   wherein the one or more processors calculate, as the first quantity value, an electric current deviation rate calculated based on a result obtained by dividing an electric current value indicating an amount of electric current output from the solar cell that is a certain solar cell of a plurality of solar cells by an electric current conversion value corresponding to a plurality of electric current values indicating respective amounts of electric current output from the plurality of solar cells.

2. The solar power generation fault diagnosis device according to claim 1, wherein the one or more processors determine the state of the solar cell based on a result of determination whether a difference between the first quantity value and the second quantity value is equal to or larger than or is equal to or smaller than a certain value.

3. The solar power generation fault diagnosis device according to claim 2, wherein the one or more processors determine that the solar cell is in a faulty state when the one or more processors continuously determine that the difference between the first quantity value and the second quantity value is equal to or larger than or is equal to or smaller than the certain value for a certain time period.

4. The solar power generation fault diagnosis device according to claim 1, wherein the electric current conversion value is any one of:
   an average current value that is an average of the plurality of electric current values indicating respective amounts of electric current output from the plurality of solar cells;
   a median current value that is a median of the plurality of electric current values indicating respective amounts of electric current output from the plurality of solar cells;
   a frequent current value that is an electric current value, which occurs most frequently, of the plurality of electric current values indicating respective amounts of electric current output from the plurality of solar cells; and
   a specific average current value that is an average of electric current values excluding specific values from the plurality of electric current values indicating respective amounts of electric current output from the plurality of solar cells.

5. The solar power generation fault diagnosis device according to claim 1, wherein the low-pass filter is an infinite impulse response (IIR) filter.

6. The solar power generation fault diagnosis device according to claim 1, wherein the low-pass filter is a finite impulse response (FIR) filter.

7. A non-transitory computer readable recording medium storing a computer program that causes a computer to execute the following:
   receiving signals indicating an electrical quantity output from a solar cell to acquire quantity information indicating the electrical quantity output from the solar cell;
   calculating a first quantity value relating to the electrical quantity based on the quantity information;
   implementing a low-pass filter unit so as to output a second quantity value from the first quantity value;
   determining a state of the solar cell based on a result of comparison between the first quantity value and the second quantity value; and
   outputting the determined state of the solar cell;
   wherein the calculating includes calculating, as the first quantity value, an electric current deviation rate calculated based on a result obtained by dividing an electric current value indicating an amount of electric current output from the solar cell that is a certain solar cell of a plurality of solar cells by an electric current conversion value corresponding to a plurality of electric current values indicating respective amounts of electric current output from the plurality of solar cells.

8. A solar power generation fault diagnosis method implemented by a computer, the method comprising:
   receiving signals indicating an electrical quantity output from a solar cell to acquire quantity information indicating the electrical quantity output from the solar cell;
   calculating a first quantity value relating to the electrical quantity based on the quantity information;
   implementing a low-pass filter unit so as to output a second quantity value from the first quantity value;
   determining a state of the solar cell based on a result of comparison between the first quantity value and the second quantity value; and
   outputting the determined state of the solar cell;
   wherein the calculating includes calculating, as the first quantity value, an electric current deviation rate calculated based on a result obtained by dividing an electric current value indicating an amount of electric current output from the solar cell that is a certain solar cell of a plurality of solar cells by an electric current conversion value corresponding to a plurality of electric current values indicating respective amounts of electric current output from the plurality of solar cells.

* * * * *